United States Patent
Sung (10) Patent No.: US 11,428,967 B2
(45) Date of Patent: Aug. 30, 2022

(54) COVER WINDOW INCLUDING ANTI-POLLUTION LAYER AT OPENING AND DISPLAY DEVICE INCLUDING THE SAME

(71) Applicant: Samsung Display Co., LTD., Yongin-si (KR)

(72) Inventor: Sujin Sung, Hwaseong-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 79 days.

(21) Appl. No.: 16/565,644

(22) Filed: Sep. 10, 2019

(65) Prior Publication Data

US 2020/0117029 A1    Apr. 16, 2020

(30) Foreign Application Priority Data

Oct. 10, 2018 (KR) .................. 10-2018-0120325

(51) Int. Cl.
| | | |
|---|---|---|
| *G02F 1/1333* | (2006.01) | |
| *B32B 27/30* | (2006.01) | |
| *B32B 27/36* | (2006.01) | |
| *B32B 7/02* | (2019.01) | |
| *G02F 1/135* | (2006.01) | |

(52) U.S. Cl.
CPC .............. *G02F 1/1333* (2013.01); *B32B 7/02* (2013.01); *B32B 27/30* (2013.01); *B32B 27/365* (2013.01); *B32B 2457/20* (2013.01); *G02F 1/1351* (2021.01); *G02F 2202/28* (2013.01)

(58) Field of Classification Search
CPC .. G02F 1/1333; G02F 1/1351; G02F 2202/28; G02F 1/133331; G02F 1/133512; B32B 27/30; B32B 27/365; B32B 7/02; B32B 2457/20; H01L 51/524; H01L 51/5284; H01L 27/3227; G09F 9/00; H04M 1/026; H04M 1/0266
See application file for complete search history.

(56) References Cited

U.S. PATENT DOCUMENTS

| | | | | |
|---|---|---|---|---|
| 2006/0262405 A1* | 11/2006 | Brumwell | ............... | G02B 1/105 359/588 |
| 2009/0027603 A1* | 1/2009 | Samulski | .......... | G02F 1/133711 349/124 |
| 2015/0346554 A1* | 12/2015 | Lee | .................... | G02F 1/133514 349/69 |

(Continued)

FOREIGN PATENT DOCUMENTS

| | | | | |
|---|---|---|---|---|
| KR | 20130063570 | * | 6/2013 | ............. G06F 3/042 |
| KR | 1020130063570 A | | 6/2013 | |

(Continued)

*Primary Examiner* — Anthony J Frost
(74) *Attorney, Agent, or Firm* — Cantor Colburn LLP (57) ABSTRACT

A cover window of a display device includes: a transparent layer; a light blocking layer disposed on the transparent layer, the light blocking layer defining an opening therein, the opening exposing a portion of the transparent layer which corresponds to a sensor of the display device; and an anti-pollution layer disposed corresponding to the portion of the transparent layer which corresponds to the sensor of the display device and is exposed by the opening. The anti-pollution layer has a surface energy lower than each of a surface energy of the transparent layer and a surface energy of the light blocking layer.

20 Claims, 8 Drawing Sheets

(56) References Cited

U.S. PATENT DOCUMENTS

| | | | |
|---|---|---|---|
| 2016/0023941 A1* | 1/2016 | Brown | C03C 23/006 428/212 |
| 2016/0125220 A1* | 5/2016 | Lun | G06K 7/08 382/124 |
| 2016/0209959 A1* | 7/2016 | Lee | G06F 3/0443 |
| 2017/0161543 A1* | 6/2017 | Smith | G06K 9/0004 |

FOREIGN PATENT DOCUMENTS

| | | |
|---|---|---|
| KR | 101327531 B1 | 11/2013 |
| KR | 1020140003046 A | 1/2014 |
| KR | 101907253 B1 | 10/2018 |

* cited by examiner

COVER WINDOW INCLUDING ANTI-POLLUTION LAYER AT OPENING AND DISPLAY DEVICE INCLUDING THE SAME

This application claims priority to Korean Patent Application No. 10-2018-0120325, filed on Oct. 10, 2018, and all the benefits accruing therefrom under 35 U.S.C. § 119, the disclosure of which is incorporated by reference herein in its entirety.

BACKGROUND

1. Field

Embodiments of the invention relate to a cover window capable of ensuring reliability of a sensor unit of a display device and a display device including the cover window.

2. Description of the Related Art

A cover window is provided on a display surface of a display device such as a liquid crystal display ("LCD") device, an organic light emitting diode ("OLED") display device, a plasma display panel ("PDP") device, and an electrophoretic display device.

Such a cover window is disposed on a back surface of a transparent layer and includes a light blocking layer that defines a bezel (e.g., a non-display area) of a display device. The light blocking layer has an opening to allow images displayed on a display panel to pass through the light blocking layer. The light blocking layer of the cover window also has openings for elements of the display device, e.g., a camera and various light receiving sensors, such as a proximity sensor and a fingerprint recognition sensor.

SUMMARY

Embodiments of the invention may be directed to a cover window of a display device which is capable of reducing or effectively preventing an adhesive of a protective film from remaining in an opening of the cover window which corresponds to a sensor of the display device, and to a display device including the cover window.

According to an embodiment, a cover window includes: a transparent layer; a light blocking layer disposed on the transparent layer, the light blocking layer defining an opening therein, the opening exposing a portion of the transparent layer which corresponds to a sensor of the display device; and an anti-pollution layer disposed corresponding to the portion of the transparent layer which corresponds to the sensor of the display device and is exposed by the opening. The anti-pollution layer has a surface energy lower than each of a surface energy of the transparent layer and a surface energy of the light blocking layer.

The anti-pollution layer may be disposed in the opening and may extend from the opening to be disposed on a portion of the light blocking layer which is adjacent to the opening.

The anti-pollution layer may be disposed in the opening and may extend to have a planar area larger than a planar area of the opening.

The anti-pollution layer may have a surface energy of about 40 dynes per centimeter (dynes/cm) or less.

The anti-pollution layer may have a surface energy of about 20 dynes/cm or less.

The anti-pollution layer may have a water contact angle of about 90 degrees or more.

The anti-pollution layer may have a hexadecane contact angle of about 25 degrees or more.

The anti-pollution layer may include a fluorine material.

The fluorine material may include at least one of: perfluoropolyether ("PFPE"), polytetrafluoroethylene ("PTFE"), fluorinated ethylene propylene ("FEP") and a perfluoroalkyl vinyl ether copolymer.

The anti-pollution layer may further include an adhesion improving layer which improves adhesion of the anti-pollution layer to the light blocking layer, the adhesion improving layer disposed corresponding to the portion of the transparent layer which corresponds to the sensor of the display device and is exposed by the opening.

The adhesion improving layer may include $SiO_2$.

The anti-pollution layer may have a protrusion pattern.

The cover window may further include a first protective film removably disposable on the anti-pollution layer.

The first protective film and the anti-pollution layer may be removably attached to each other using a first adhesive.

The cover window may further include a second protective film removably attachable to the first protective film. The first protective film and the second protective film may be removably attached to each other using a second adhesive.

The second adhesive may seal the first protective film on the anti-pollution layer.

The anti-pollution layer may be disposed in the opening to be spaced apart from side surfaces of the light blocking layer which define the opening therein.

According to an embodiment, a display device includes: a display panel; a light receiving sensor; and a cover window overlapping the display panel and the light receiving sensor. The cover window includes: a transparent layer; a first light blocking layer between the transparent layer and the display panel, the light blocking layer defining an opening therein, the opening exposing a portion of the transparent layer which corresponds to the light receiving sensor of the display device; and an anti-pollution layer between the first light blocking layer and the display panel, the anti-pollution layer corresponding to the portion of the transparent layer which corresponds to the light receiving sensor of the display device and is exposed by the opening. The anti-pollution layer has a surface energy lower than each of a surface energy of the transparent layer and a surface energy of the light blocking layer.

The light receiving sensor to which the portion of the transparent layer corresponds may include an infrared sensor. The cover window may further include a second light blocking layer including a semi-transmissive material layer disposed between the first light blocking layer and the anti-pollution layer, the second light blocking layer corresponding to the portion of the transparent layer which corresponds to the infrared sensor and is exposed by the opening.

The opening defined by the first light blocking layer may correspond to an image display area of the display panel. The light receiving sensor may overlap the opening corresponding to the image display area, in a top plan view.

The foregoing is illustrative only and is not intended to be in any way limiting. In addition to the illustrative embodiments and features described above, further embodiments and features will become apparent by reference to the drawings and the following detailed description.

BRIEF DESCRIPTION OF THE DRAWINGS

A more complete appreciation of the invention will become more apparent by describing in detail embodiments thereof with reference to the accompanying drawings, in which:

FIG. 4 is an enlarged top plan view of an embodiment of area A of the cover window member illustrated in FIG. 3a;

DETAILED DESCRIPTION

Embodiments will now be described more fully hereinafter with reference to the accompanying drawings. Although the invention may be modified in various manners and have several embodiments, embodiments are illustrated in the accompanying drawings and will be mainly described in the specification. However, the scope of the invention is not limited to the embodiments and should be construed as including all the changes, equivalents and substitutions included in the spirit and scope of the invention.

In the drawings, thicknesses of a plurality of layers and areas are illustrated in an enlarged manner for clarity and ease of description thereof. When a layer, area, or plate is referred to as being related to another element such as being "on" another layer, area, or plate, it may be directly on the other layer, area, or plate, or intervening layers, areas, or plates may be present therebetween. Conversely, when a layer, area, or plate is referred to as being related to another element such as being "directly on" another layer, area, or plate, intervening layers, areas, or plates are absent therebetween. Further when a layer, area, or plate is referred to as being related to another element such as being "below" another layer, area, or plate, it may be directly below the other layer, area, or plate, or intervening layers, areas, or plates may be present therebetween. Conversely, when a layer, area, or plate is referred to as being related to another element such as being "directly below" another layer, area, or plate, intervening layers, areas, or plates are absent therebetween.

The spatially relative terms "below," "beneath," "lower," "above," "upper" and the like, may be used herein for ease of description to describe the relations between one element or component and another element or component as illustrated in the drawings. It will be understood that the spatially relative terms are intended to encompass different orientations of the device in use or operation, in addition to the orientation illustrated in the drawings. For example, in a case where a device illustrated in the drawing is turned over, the device positioned "below" or "beneath" another device may be placed "above" another device. Accordingly, the illustrative term "below" may include both the lower and upper positions. The device may also be oriented in the other direction and thus the spatially relative terms may be interpreted differently depending on the orientations.

Throughout the specification, when an element is referred to as being "connected" to another element, the element is "physically connected" or "contacting" the other element, or "electrically connected" to the other element with one or more intervening elements interposed therebetween.

The terminology used herein is for the purpose of describing particular embodiments only and is not intended to be limiting. As used herein, the singular forms "a," "an," and "the" are intended to include the plural forms, including "at least one," unless the content clearly indicates otherwise. "At least one" is not to be construed as limiting "a" or "an." "Or" means "and/or." As used herein, the term "and/or" includes any and all combinations of one or more of the associated listed items. It will be further understood that the terms "comprises," "comprising," "includes" and/or "including," when used in this specification, specify the presence of stated features, integers, steps, operations, elements, and/or components, but do not preclude the presence or addition of one or more other features, integers, steps, operations, elements, components, and/or groups thereof.

It will be understood that, although the terms "first," "second," "third," and the like may be used herein to describe various elements, these elements should not be limited by these terms. These terms are only used to distinguish one element from another element. Thus, "a first element" discussed below could be termed "a second element" or "a third element," and "a second element" and "a third element" may be termed likewise without departing from the teachings herein.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10% or 5% of the stated value.

Unless otherwise defined, all terms used herein (including technical and scientific terms) have the same meaning as commonly understood by those skilled in the art to which this invention pertains. It will be further understood that terms, such as those defined in commonly used dictionaries, should be interpreted as having a meaning that is consistent with their meaning in the context of the relevant art and will not be interpreted in an ideal or excessively formal sense unless clearly defined at the present specification.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Some of the portions which are not associated with the description may not be provided in order to specifically describe embodiments of the invention and like reference numerals refer to like elements throughout the specification.

Within a display device, a cover window may include a light blocking layer that defines a bezel of the display device. The light blocking layer may include or define various openings through which an image is viewable to outside the display device and through which elements of the display device, e.g., a camera and various light receiving sensors, such as a proximity sensor and a fingerprint recognition sensor, are exposed to outside the display device to receive light or other signals from outside thereof.

The light blocking layer of the cover window may be easily broken during transportation and assembly processes of the display device. In order to reduce or effectively prevent damage to the light blocking layer of the cover window, a protective film may be attached to a back surface of the cover window such as by using an adhesive, and the protective film may be removed before the cover window is coupled to another component of the display device. However, the adhesive which attaches the protective film to the cover window may undesirably spread into one or more opening of the light blocking layer, and the adhesive which has spread may remain in the opening even when the protective film is removed from the cover window. The adhesive remaining in the opening of the cover window may block or disturb a light passing through the opening to thereby deteriorate the sensing ability of a light receiving sensor.

An embodiment of cover window member CWP such as for a display device will be described in detail with reference to FIGS. 1 to 6.

Figure 1:
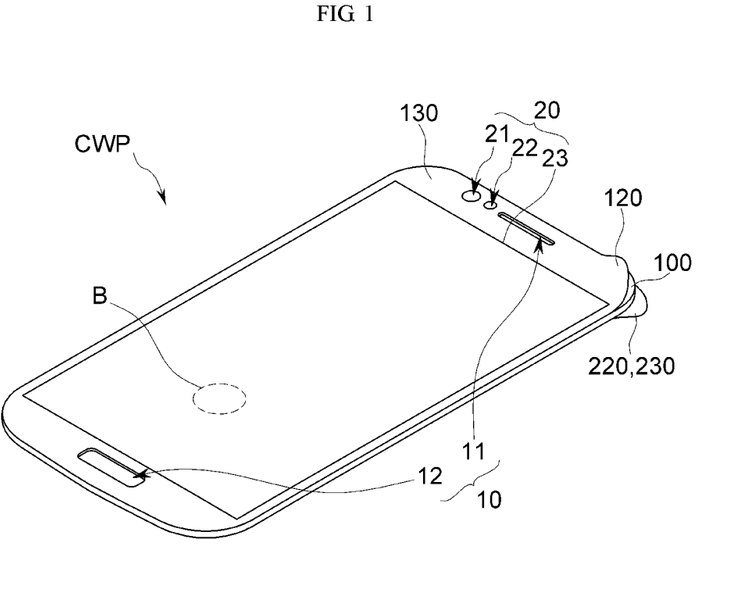
FIG. 1 is a perspective view illustrating an embodiment of a cover window member.
Figure 2:
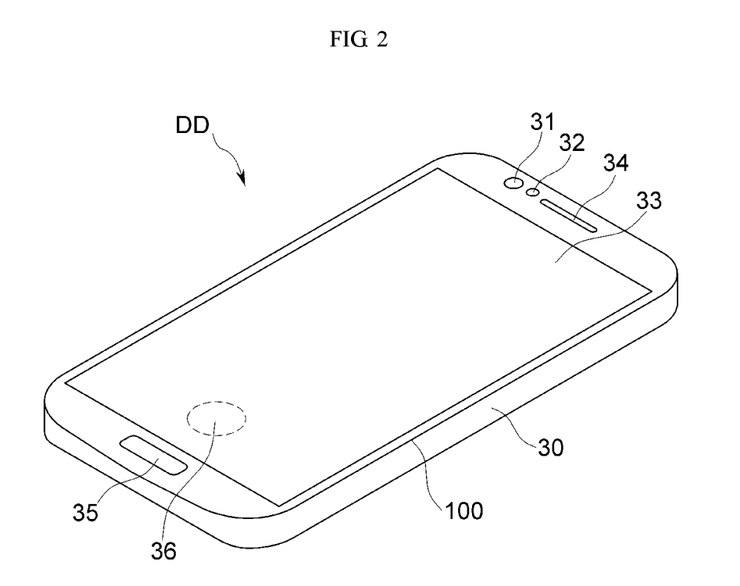
FIG. 2 is a perspective view illustrating an embodiment of a display device to which a cover window of the cover window member illustrated in FIG. 1 is attachable.

FIG. 1 is a perspective view illustrating an embodiment of a cover window member CWP, and FIG. 2 is a perspective view illustrating an embodiment of a display device DD including a cover window 100 of the cover window member CWP illustrated in FIG. 1 coupled thereto. The cover window 100 may form an outermost surface of the display device DD.

Figure 3A:
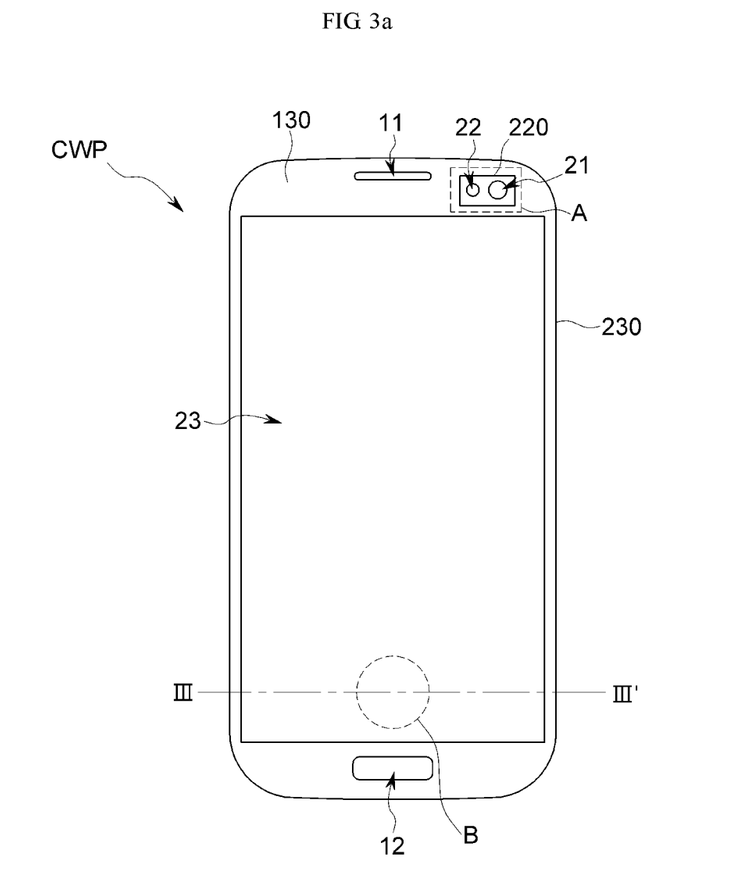
FIG. 3a is a top plan view illustrating an embodiment of a back surface of the cover window member illustrated in FIG. 1.
Figure 3B:
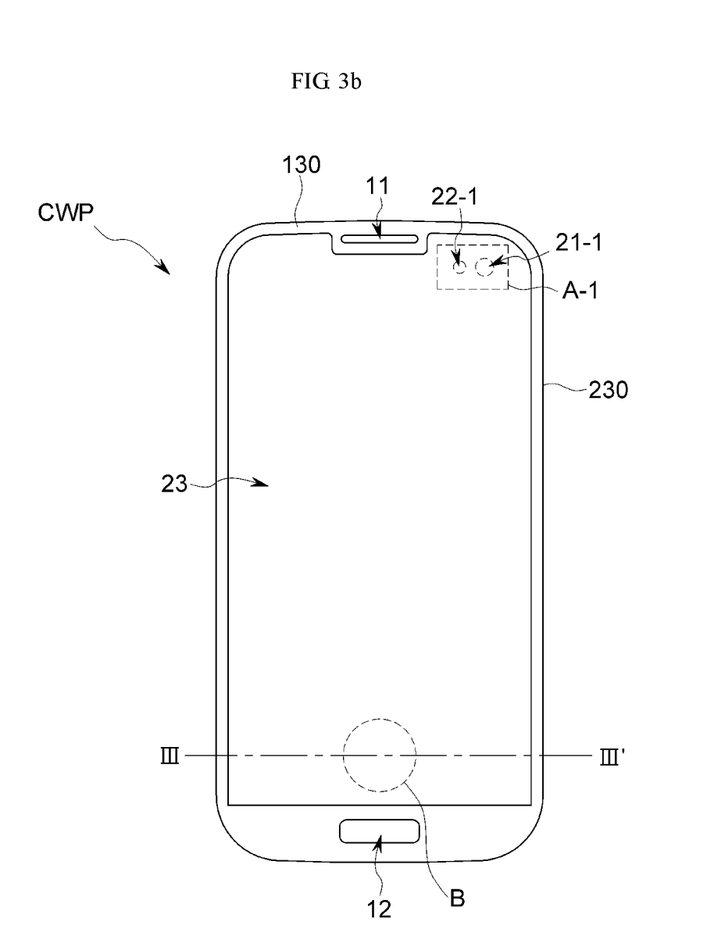
FIG. 3b is a top plan view illustrating another embodiment of a back surface of a cover window member illustrated in FIG. 1.
Figure 4:
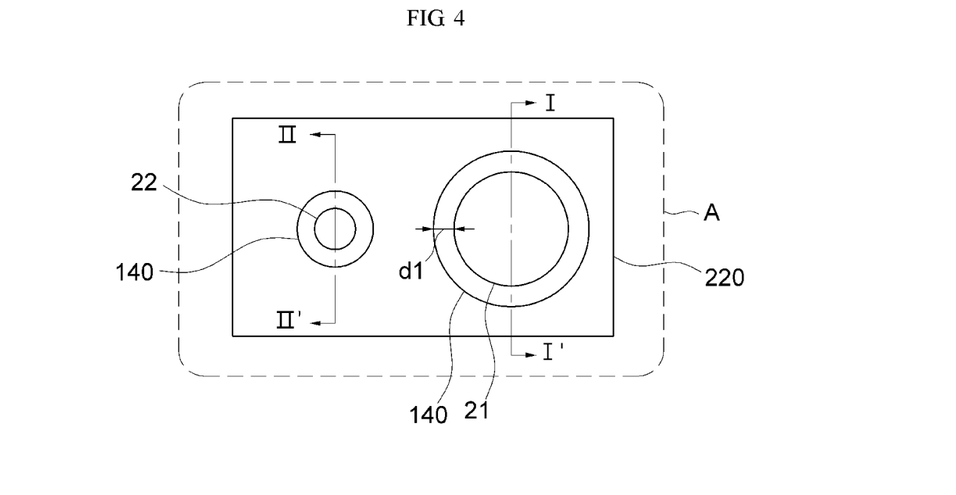
Figure 5:
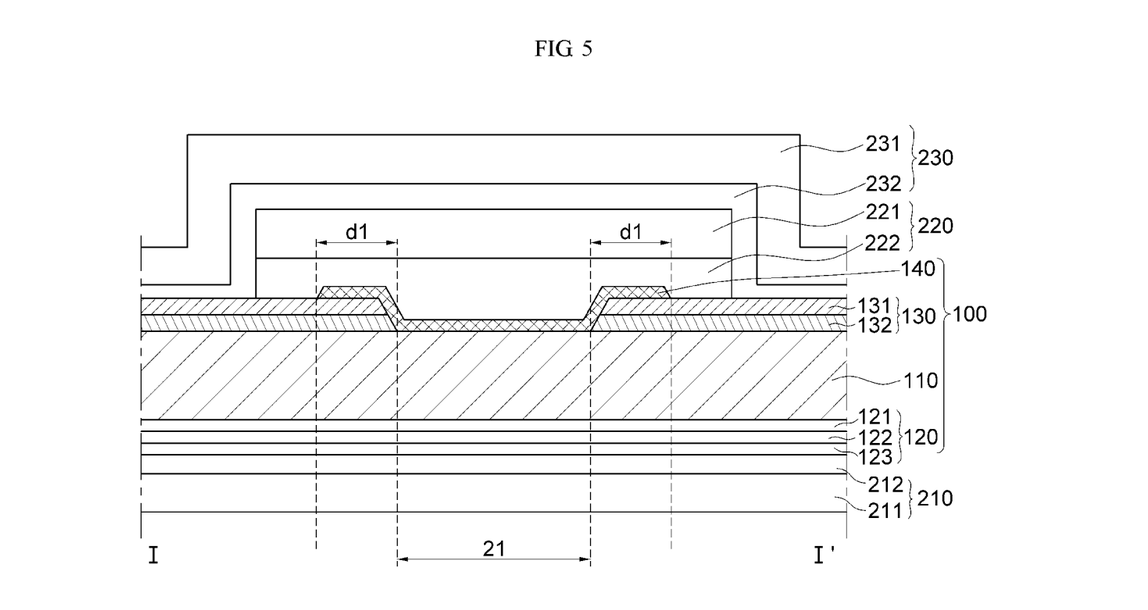
FIG. 5 is a cross-sectional view of the cover window member taken along line I-I' of FIG. 4.
Figure 6:
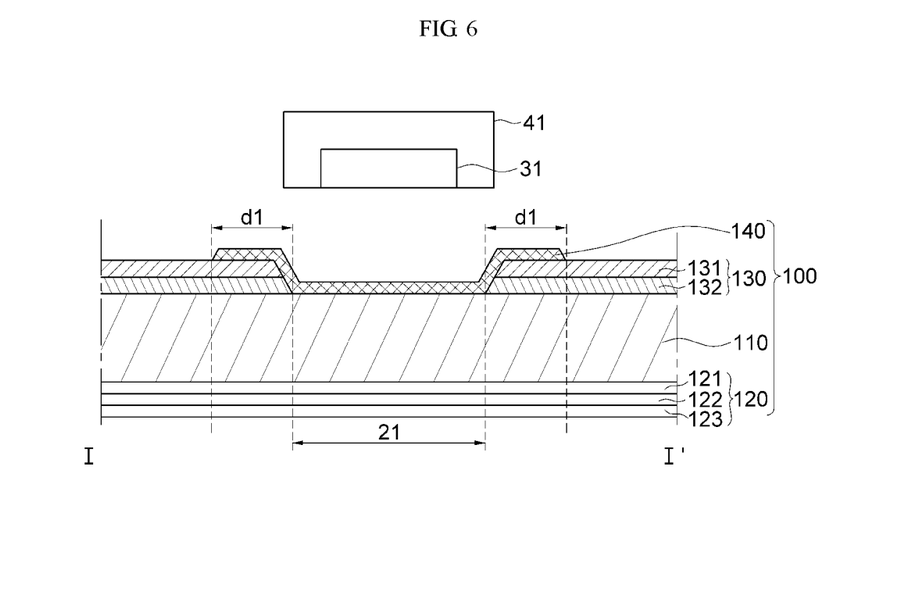
FIG. 6 is a cross-sectional view illustrating an embodiment of a cover window of cover window member with respect to a portion of a display device.

FIG. 3a is a top plan view illustrating an embodiment of a back surface of the cover window member CWP illustrated in FIG. 1, FIG. 3b is a top plan view illustrating another embodiment of a back surface of a cover window member CWP, FIG. 4 is an enlarged top plan view of an embodiment of area A illustrated in FIG. 3a, FIG. 5 is a cross-sectional view of the cover window member taken along line I-I' of FIG. 4, and FIG. 6 is a cross-sectional view illustrating an embodiment of a cover window of a cover window member with respect to a portion of a display device DD.

Referring to FIGS. 1, 2, 3a, 4 and 5, a cover window member CWP includes a cover window 100, a front surface protection member 210 that covers a portion or entirety of a front surface of the cover window 100, and an opening protection member 220 and a back surface protection member 230 that cover a portion or entirety of a back surface of the cover window member CWP.

Hereinbelow, a back surface of each of members, layers, thin films, or films included in the cover window member CWP refers to a surface that faces toward a display panel or a surface that faces toward an inner portion of a display device, a front surface thereof refers to a surface that faces toward a direction opposite to the back surface or a surface that faces outwardly of a display device (e.g., a viewing side), and a side surface thereof refers to a surface that is in contact with the front surface and the back surface such as to connect the front surface and the back surface to each other.

Referring to FIG. 2, a display device DD may include various elements such as a home button 35, a voice speaker 34, a camera lens 31, a proximity sensor light receiving portion 32, a display panel 33 and a light receiving portion 36, in a space defined by a body 30 and the cover window 100.

The display device DD, the cover window member CWP and various components thereof may be disposed in a plane defined by a first direction and a second direction which cross each other. In FIG. 3a, the horizontal direction or the vertical direction may represent the first direction or the second direction. A thickness of the display device DD, the cover window member CWP and various components thereof is extended in a third direction which crosses each of the first direction and the second direction. In FIG. 5, for example, a vertical direction represents the thickness of components, while the horizontal direction represents the first direction and/or the second direction.

Referring to FIGS. 1 and 2, the cover window 100 includes or defines a voice speaker opening 11, a home button opening 12, a camera lens opening 21, a proximity sensor opening 22, and an image display opening 23 that are located in areas overlapping, in a top plan view, respectively corresponding the voice speaker 34, the home button 35, the camera lens 31, the proximity sensor light receiving portion 32, and the display panel 33. One or more among the voice speaker opening 11, the home button opening 12, the camera lens opening 21, the proximity sensor opening 22 and the image display opening 23 may expose the corresponding one of the voice speaker 34, the home button 35, the camera lens 31, the proximity sensor light receiving portion 32, and the display panel 33 to outside the cover window 100 and/or the display device DD, without being limited thereto.

In an embodiment, for example, the voice speaker opening 11 and the home button opening 12 are a portion of an opening 10 that is defined completely through a thickness of the cover window 100, and the voice speaker 34 and the home button 35 of the display device DD, for example, may be exposed to outside the cover window 100 by the opening 10.

Referring to FIGS. 1 and 5, for example, the camera lens opening 21, the proximity sensor opening 22 and the image display opening 23 are a portion of an opening 20 that is defined not completely through (e.g., partially through) the thickness the cover window 100. The opening 20 which does not extend completely through the thickness the cover window 100 may be defined extended through a thickness of a light blocking layer 130 within the cover window 100.

In addition, as illustrated in FIG. 2, the light receiving portion 36 of the display device DD for other sensors, e.g., a fingerprint sensor and a camera lens, may be disposed at an area B in the image display opening 23. Accordingly, the opening 10 or the opening 20 may not be separately defined within the cover window 100 for the light receiving portion 36 for other sensors, e.g., a fingerprint sensor and a camera lens.

In addition, as illustrated in FIG. 3b, the camera lens 31 or the proximity sensor light receiving portion 32 may also be disposed in an area A-1 in the image display opening 23. The camera lens 31 or the proximity sensor light receiving portion 32 may be dispose in an area where images of the display panel 33 are displayed, e.g., corresponding to the image display opening 23. Accordingly, different from the camera lens opening 21 and the proximity sensor opening 22 shown in FIG. 3a as an example of the opening 20, areas 21-1 and 22-1 corresponding to the camera lens 31 and the proximity sensor light receiving portion 32 in an image display area of the display panel 33 may not include the opening 20 separately defined in the cover window member CWP, which will be described in detail hereinbelow with reference to FIGS. 10 and 11.

The planar shape, planar position, planar size and number of the opening 10, the opening 20, and portions thereof of the cover window 100 may vary depending on the display device DD to which the cover window 100 is attachable.

Referring to FIG. 1 and FIG. 5, the front surface protection member 210 is disposed on the cover window 100, and may cover an entirety of the front surface of the cover window 100. The front surface protection member 210 has a planar area substantially equal to a planar area of the cover window 100, in the top plan view. In an embodiment, the front surface protection member 210 may have a planar area less than or larger than the planar area of the cover window 100.

Referring to FIG. 5, the front surface protection member 210 may include a front surface protective film 211 and an adhesive 212. The front surface protective film 211 may include a transparent material. In an embodiment, for example, the front surface protective film 211 may include a plastic material, e.g., polyethylene terephthalate, polycarbonate, polyethylene, polyimide or polyolefin. The adhesive 212 is applied to a back surface of the front surface protective film 211, and may include a material having adhesiveness, e.g., a silicone resin or an acrylic resin.

As illustrated in FIG. 6, the front surface protection member 210 may be removed before or after assembling the display device DD to include the cover window member CWP attached thereto. That is, the front surface protection member 210 is removably attachable to the cover window 100, to be attachable to and detachable from a front surface of the cover window 100.

Referring to FIG. 3a, the cover window member CWP includes an opening protection member 220 disposed on the back surface of the cover window 100 and covering one or more portions of the opening 20 of the cover window 100. However, embodiments are not limited thereto, and the opening protection member 220 may cover an entirety of the back surface of the cover window 100 such as to cover each of the opening 10 and the opening 20.

Referring to FIG. 5, the opening protection member 220 may include an opening protective film 221 and an adhesive 222. The opening protective film 221 may include a transparent material or an opaque material. In an embodiment, for example, the opening protective film 221 may include a plastic material, e.g., polyethylene terephthalate, polycarbonate, polyethylene, polyimide or polyolefin. The adhesive 222 may be applied to an entirety of a front surface of the opening protective film 221. The adhesive 222 may include a pressure sensitive adhesive ("PSA"). The adhesive 222 may include a material having adhesiveness, e.g., a silicone resin or an acrylic resin.

The opening protection member 220 may be a relatively thin film sheet or a masking tape which is coated with an adhesive on one surface thereof.

As illustrated in FIG. 6, the opening protection member 220 is removed before assembling the display device. That is, the opening protection member 220 is removably attachable to the cover window 100, to be attachable to and detachable from a back surface of the cover window 100.

Referring to FIGS. 1 and 5, the cover window member CWP includes a back surface protection member 230 disposed on the back surface of the cover window 100 and covering an entirety of the back surface of the cover window 100. Accordingly, portions of the back surface protection member 230 are respectively disposed on a back surface of the opening protection member 220 to cover the back surface of the opening protection member 220, and on the back surface of the cover window 100 that is not covered with the opening protection member 220 to be exposed therefrom. That is, the cover window 100 and the back surface protection member 230 each extends further than outer edges of the opening protection member 220. As illustrated in FIG. 5, each of the back surface protection member 230 and the opening protection member 220 extends further than outer edges of the camera lens opening 21.

In an embodiment, the back surface protection member 230 may be omitted. As illustrated in FIG. 6, the back surface protection member 230 is removed before assembling the display device DD. That is, the back surface protection member 230 is removably attachable to the cover window 100 and the opening protection member 220, to be attachable to and detachable from the back surface of the cover window 100 and the back surface of the opening protection member 220.

Referring to FIG. 5, the back surface protection member 230 may include a back surface protective film 231 and an adhesive 232. The back surface protective film 231 may include a transparent material or an opaque material. In an embodiment, for example, the back surface protective film 231 may include a plastic material, e.g., polyethylene terephthalate, polycarbonate, polyethylene, polyimide or polyolefin. The adhesive 232 may be applied over an entirety of a front surface of the back surface protective film 231. The adhesive 232 may include a pressure sensitive adhesive ("PSA"). The adhesive 232 may include a material having adhesiveness, e.g., a silicone resin or an acrylic resin.

The adhesive 232 may attach a back surface of the opening protective film 221 and a front surface of the back surface protective film 231 to each other. In addition, the adhesive 232 may attach the front surface of the back surface protective film 231 to a back surface of the cover window 100 that is not covered with the opening protection member 220.

As illustrated in FIG. 6, each of the front surface protection member 210, the opening protection member 220 and the back surface protection member 230 may be removed before assembling the display device DD. Taking FIG. 5 and FIG. 6 together, the removing of the front surface protection member 210, the opening protection member 220 and the back surface protection member 230 exposes one or more of the layers which were disposed respectively between the front surface protection member 210, and the opening protection member 220 and the back surface protection member 230.

Hereinafter, an embodiment of a cover window 100 will be described in detail with reference to FIGS. 1 to 6.

The cover window 100 is considered as a collection of layers of the cover window member CWP except for layers of the front surface protection member 210, the opening protection member 220 and the back surface protection member 230 which are each removably disposed with the cover window 100, such as to be removed at the time of assembling the display device DD.

The cover window 100 includes a transparent window defined by a transparent layer 110 including a transparent material, an optical layer 120 disposed on a front surface of the transparent layer 110, a light blocking layer 130 disposed on the back surface of the transparent layer 110, and an anti-pollution layer 140.

The transparent layer 110 serves to define a front surface of the display device DD, protects each of a display panel 33 and various sensors 31-36 disposed therebelow, and includes a material which resists deformation and provides sufficient rigidity. In addition, the transparent layer 110 also serves as a substrate to respectively support the optical layer 120, the light blocking layer 130, and the anti-pollution layer 140 disposed above and below the transparent layer 110.

The transparent layer 110 may include, for example, glass, reinforced glass, plastic, or reinforced plastic that has transparency. The transparent layer 110 may include two or more plastic films attached to each other.

The transparent layer 110 includes a material through which light or other signals for images of the display panel 33, the camera sensor, the proximity sensor, and the fingerprint recognition sensor may pass through, for example. The transparent layer 110 may include or define one or more of the opening 10 such as the voice speaker opening 11 and the home button opening 12. The opening 10 such as the voice speaker opening 11 and the home button opening 12 may be defined extended through an entirety of the thickness of the transparent layer 110.

The optical layer 120 may be disposed on the front surface of the transparent layer 110, and cover an entirety of the front surface of the transparent layer 110.

The optical layer 120 may include at least one of an anti-glare ("AG") coating layer 121 for reducing or effectively preventing light refraction, an anti-reflective ("AR") coating layer 122 for reducing or effectively preventing reflected light, and an anti-finger ("AF") coating layer 123 for reducing or effectively preventing fingerprints remaining on the optical layer 120.

The AG coating layer 121 is provided to reduce or effectively prevent light glare by blocking light refraction, and may include a circular polarization plate and/or a pattern engraving technique.

The AR coating layer 122 is provided to reduce or effectively prevent reflection of light. The AR coating layer 122 may improve transparency of the optical layer 120 by lowering both a refractive index and a reflectance thereof.

The AF coating layer 123 is provided to reduce or effectively prevent fingerprints remaining on the optical layer 120. The AF coating layer 123 may include a material such that a wetting property of a hard coating agent increases, and even if fingerprint components adhere thereto, the fingerprint components may not be noticeable. The AF coating layer 123 and the anti-pollution layer 140, to be described below, may include a substantially same material and be formed in a substantially same method or process.

The light blocking layer 130 is disposed on the back surface of the transparent layer 110.

The light blocking layer 130 may be embodied as a single-layered structure or multi-layered structure to define the light blocking layer 130. In an embodiment, for example, the light blocking layer 130 may include a first light blocking layer 132 disposed on the back surface of the transparent layer 110, and a second light blocking layer 131 disposed on a back surface of the first light blocking layer 132. The first light blocking layer 132 may include a light blocking material such as a black ink to reduce or effectively prevent visibility of a non-display area (e.g., a bezel area) around an image display area of the display panel 33, an area around the camera lens 31, and an area around the proximity sensor light receiving portion 32. The second light blocking layer 131 enhances a light blocking ratio by reinforcing the first light blocking layer 132.

The light blocking layer 130 includes or defines one or more of the opening 20 that exposes a portion of the back surface of the transparent layer 110. Referring to FIG. 1 and FIG. 2, the opening 20 corresponds to the camera lens opening 21, the proximity sensor opening 22, and the image display opening 23, for example.

Referring to FIG. 6, the camera lens opening 21 of the light blocking layer 130 overlaps the camera lens 31 of a camera module 41, in a top plan view. The camera module 41 is shown disposed facing the back surface of the cover window 100 which faces toward the display panel 33 and layers of the display panel 33 are omitted for convenience of illustration. It will be understood that the camera module 41 may be disposed within the display panel 33. Although the camera lens opening 21 is exemplified in FIGS. 4, 5 and 6, the camera lens opening 21 and structure adjacent thereto shown in detail in FIGS. 4, 5, and 6 may correspond to any of the proximity sensor opening 22, the image display opening 23, or any other one of the opening 20.

The anti-pollution layer 140 is disposed on the back surface of the transparent layer 110 that is exposed by the opening 20 in the light blocking layer 130. In addition, the anti-pollution layer 140 may be disposed on side surface and a back surface of the light blocking layer 130 that surrounds the opening 20 in a top plan view. That is, the anti-pollution layer 140 in the opening 20 extends from the transparent layer 110, along side surfaces of the light blocking layer 130 which define the opening 20, to be disposed outside the opening 20 and on the back surface of the light blocking layer 130 closest to the opening 20.

The anti-pollution layer 140 has a planar area larger than a planar area of the opening 20 in a top plan view. Referring to the camera lens opening 21 for a structure of the opening 20, for example, the anti-pollution layer 140 may be continuously disposed over an entire planar area of the camera lens opening 21 in addition to a predetermined distance d1 from each of opposing outer edges of the camera lens opening 21. The anti-pollution layer 140 shown in FIG. 6 which terminates at the distance d1, exposes a portion of the back surface of the cover window 100 at the second light blocking layer 131, but is not limited thereto.

In an embodiment, for example, the distance d1 may be greater than or substantially equal to about 1 millimeter (mm). In an embodiment, for example, the distance d1 may be greater than or substantially equal to about 10 mm. However, embodiments are not limited thereto, and the anti-pollution layer 140 may be disposed over an entirety of the back surface of the cover window 100.

The anti-pollution layer 140 substantially reduces or effectively prevents the adhesive 222 that is applied over the front surface of the opening protective film 221 from being transferred to and remaining in an area of the opening 20 of the cover window 100 when the opening protective film 221 having the adhesive 222 is peeled off to be removed from the cover window 100.

An adhesive force between the anti-pollution layer 140 and the adhesive 222 is significantly lower than an adhesive force between the transparent layer 110 and the adhesive 222. Accordingly, transfer of the adhesive 222 from the front surface of the opening protective film 221 to a back surface of the anti-pollution layer 140 may be substantially reduced or effectively prevented. In addition, an adhesive force between the anti-pollution layer 140 and the adhesive 222 is significantly lower than an adhesive force between the anti-pollution layer 140 and the transparent layer 110, and accordingly, peeling away of the anti-pollution layer 140 the transparent layer 110 by pulling of the adhesive 222 may be substantially reduced or effectively prevented.

The adhesive force between the anti-pollution layer 140 and the adhesive 222 may depend on water-repellent and oil-repellent characteristics of the anti-pollution layer 140. The stronger the water-repellent and oil-repellent characteristics of the anti-pollution layer 140, the weaker the adhesive force between the anti-pollution layer 140 and the adhesive 222, and accordingly, the lower the possibility that the adhesive 222 remains in the area of the opening 20.

The water-repellent and oil-repellent characteristics of the anti-pollution layer 140 may be determined according to a contact angle of a liquid to the anti-pollution layer 140. The back surface of the anti-pollution layer 140 has a water contact angle and a hexadecane contact angle that are greater than those of the back surface of the light blocking layer 130 and the back surface of the transparent layer 110, respectively.

In an embodiment, for example, a water contact angle of the back surface of the anti-pollution layer 140 is about 80 degrees or more, and a hexadecane contact angle thereof is about 25 degrees or more. In another embodiment, the water contact angle of the back surface of the anti-pollution layer 140 is about 90 degrees or more, and the hexadecane contact angle thereof is about 30 degrees or more. In still another embodiment, the water contact angle of the back surface of the anti-pollution layer 140 is about 100 degrees or more, and the hexadecane contact angle thereof is about 40 degrees or more.

In addition, the contact angle may depend on a surface energy of the anti-pollution layer 140. Accordingly, the anti-pollution layer 140 may include a material having a relatively low surface energy. The anti-pollution layer 140 has a surface energy lower than a surface energy of each of the light blocking layer 130 and the transparent layer 110.

In an embodiment, for example, the surface energy of the anti-pollution layer 140 is about 40 dynes per centimeter (dynes/cm) or less. In another embodiment, the surface energy of the anti-pollution layer 140 is about 30 dynes/cm or less. In still another embodiment, the surface energy of the anti-pollution layer 140 is about 20 dynes/cm or less.

The surface energy of the anti-pollution layer 140 may be measured by a liquid critical surface tension measurement scheme using the Zisman curve method. Alternatively, the surface energy of the anti-pollution layer 140 may be determined from two or more liquid contact angles using the Owen-Wendt equation.

Figure 12:
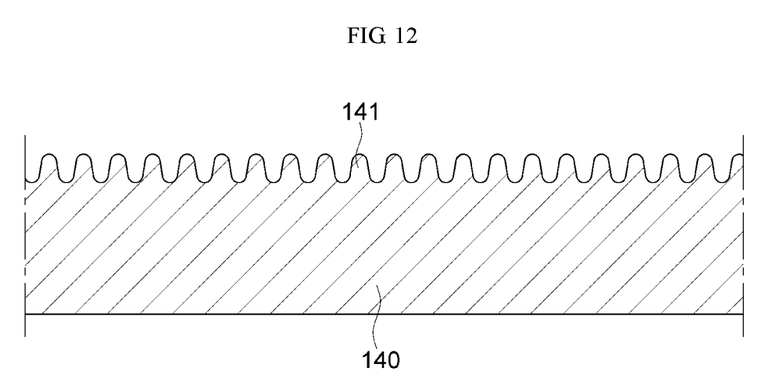
FIG. 12 is a cross-sectional view illustrating an embodiment of an anti-pollution layer of a cover window.

In addition, the contact angle may depend on the surface geometry of the anti-pollution layer 140, particularly at the back surface of the anti-pollution layer 140. Accordingly, as illustrated in the enlarged cross-sectional view of an embodiment of the anti-pollution layer 140 of FIG. 12, the surface of the anti-pollution layer 140 which faces the adhesive 222 may include a pattern defined by a protrusion 141 provided in plurality. In an embodiment, for example, a distance between two of the protrusion 141 which are sequentially adjacent to each other may be in a nanometer scale or a micrometer scale.

The anti-pollution layer 140 may include a fluorine material having a relatively low surface energy.

The fluorine material may include at least one of perfluoropolyether ("PFPE"), polytetrafluoroethylene ("PTFE"), fluorinated ethylene propylene ("FEP"), and a perfluoroalkyl vinyl ether copolymer, or a combination thereof. In an embodiment, for example, the anti-pollution layer 140 may have a fluorine content of about 50 weight percentage (wt %) or more among a total weight percentage of the anti-pollution layer 140.

The material included in the anti-pollution layer 140 is not limited to the fluorine material, and may include any material that has the above-mentioned water and hexadecane contact angle or surface energy. In an embodiment, for example, the anti-pollution layer 140 may include polyethylene and/or polydimethylsiloxane.

The anti-pollution layer 140 may have a thickness ranging from about 10 nanometers (nm) to about 200 nm. The thickness may be a maximum thickness in cross-section of the anti-pollution layer 140 along a direction normal to the light blocking layer 130 and/or the transparent layer 110. If the thickness of the anti-pollution layer 140 exceeds about 200 nm, a transmittance of light or other signals at the opening 20 may be lowered. In an embodiment, for example, the anti-pollution layer 140 may have a transmittance of about 80% or more at the opening 20. In another embodiment, the anti-pollution layer 140 may have a transmittance of about 90% or more at the opening 20.

Referring to FIGS. 4 and 5, the opening protection member 220 is removably attached to the back surface of the anti-pollution layer 140.

In an embodiment, for example, the opening protective film 221 of the opening protection member 220 may have a planar area larger than a planar area of the anti-pollution layer 140. The opening protective film 221 of the opening protection member 220 may be continuously disposed over an entirety of the back surface of the anti-pollution layer 140, extend further than outer edges of the anti-pollution layer 140, and extend along the back surface of the light blocking layer 130 that is not covered with the anti-pollution layer 140. The adhesive 222 applied over an entirety of the front surface of the opening protective film 221 contacts the back surface of the anti-pollution layer 140 and a portion of the back surface of the light blocking layer 130 that is not covered with the anti-pollution layer 140. The adhesive 222 between the opening protective film 221 and the portion of the light blocking layer 130 that is not covered with the anti-pollution layer 140 may completely enclose the anti-pollution layer 140 in a top plan view. That is, the adhesive 222 seals the anti-pollution layer 140 on the light blocking layer 130 such that the anti-pollution layer 140 is not exposed outside the cover window member CWP.

Accordingly, the adhesive 222 remaining on the anti-pollution layer 140 due to the relatively low adhesive force between the adhesive 222 and the anti-pollution layer 140 may be reduced or substantially prevented. In addition, due to a relatively high adhesive force between the adhesive 222 and the light blocking layer 130, the opening protective film 221 may be stably attached to the cover window 100, thus substantially reducing or effectively preventing a foreign matter from infiltrating into the opening 20.

Although not illustrated, in another embodiment, the opening protective film 221 may have a planar area less than a planar area of the anti-pollution layer 140, and larger than a planar area of the opening 20.

Figure 7:
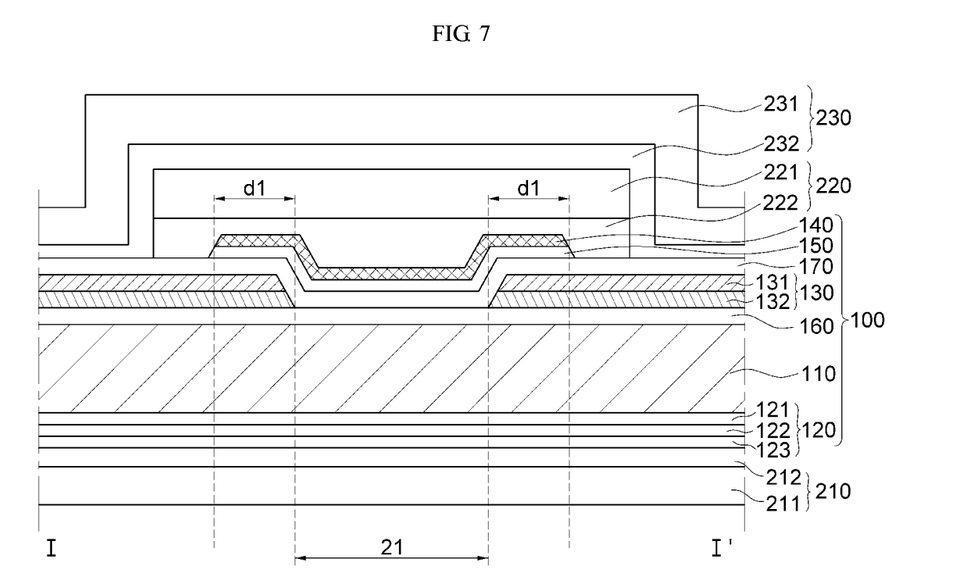
FIG. 7 is a cross-sectional view illustrating another embodiment of a cover window member taken along line I-I' of FIG. 4.

FIG. 7 is a cross-sectional view illustrating another embodiment of a cover window member taken along line I-I' of FIG. 4.

Referring to FIG. 7, a cover window 100 may further include a first layer 160 disposed between the transparent layer 110 and the light blocking layer 130, and a second layer 170 disposed between the light blocking layer 130 and the anti-pollution layer 140. The cover window 100 may include either one of the first layer 160 and the second layer 170, or may not include any of the first layer 160 and the second layer 170, as illustrated in FIG. 5.

The first layer 160 may be disposed on a back surface of the transparent layer 110. The first layer 160 may cover a portion or entirety of the back surface of the transparent layer 110. The light blocking layer 130 having the opening 20 (exemplified as the camera lens opening 21 in FIG. 7) is disposed on a back surface of the first layer 160. The opening 20 exposes the first layer 160.

The second layer 170 may be disposed on the back surface of the light blocking layer 130 and a back surface of the first layer 160 that is exposed at the opening 20. The second layer 170 may be disposed over an entirety of the back surface of the cover window 100. The anti-pollution layer 140 is disposed on the second layer 170.

The first layer 160 and the second layer 170 may be any functional thin film or film that includes a light transmitting material.

In an embodiment, for example, the first layer 160 and/or the second layer 170 may be a shatter-resistant film.

When the transparent layer 110 includes a tempered glass, the shatter-resistant film as the first layer 160 and/or the second layer 170 may substantially reduce or effectively prevent shattering of the tempered glass when the tempered glass is damaged or broken.

In an embodiment, for example, the first layer 160 and/or the second layer 170 may be a hard coating layer.

The hard coating layer is disposed on the front surface and/or the back surface of the light blocking layer 130 to protect the light blocking layer 130, and includes a resin material. The hard coating layer may include a relatively high-performance resin based on, for example, urethane acrylate or polyester acrylate.

Referring to FIG. 7, the anti-pollution layer 140 may include an adhesion improving layer 150 for improving coverage of the anti-pollution layer 140 with an underlying layer. The adhesion improving layer 150 is disposed on a back surface of each of the transparent layer 110, the first layer 160, the second layer 170, and/or the light blocking layer 130 that directly contacts the anti-pollution layer 140.

The anti-pollution layer 140 includes a material having a relatively low surface energy, for example, a fluorine material. Accordingly, an adhesive force between the anti-pollution layer 140 and the transparent layer 110, the first layer 160, the second layer 170, or the light blocking layer 130 that includes, for example, an organic polymer may be significantly deteriorated.

The adhesion improving layer 150 is disposed or formed respectively between the anti-pollution layer 140 and the transparent layer 110, the first layer 160, the second layer 170, or the light blocking layer 130 to reduce interplanar stress between two layers respectively adjacent to each other among the anti-pollution layer 140, the first layer 160, the second layer 170 and or the light blocking layer 130. Accordingly, the adhesive force between the anti-pollution layer 140 and a respective one or more among the transparent layer 110, the first layer 160, the second layer 170 and the light blocking layer 130 may be improved, and thus peeling of the anti-pollution layer 140 from the respective one or more of the aforementioned layers may be substantially reduced or effectively prevented.

The adhesion improving layer 150 may include a material that may relatively easily adhere to both of the anti-pollution layer 140 and the respective one or more of the transparent layer 110, the first layer 160, the second layer 170 and the light blocking layer 130 to which the anti-pollution layer 140 is to be attached. In an embodiment, for example, the adhesion improving layer 150 may include a silica oxide film including silicon oxide ($SiO_2$).

Figure 8:
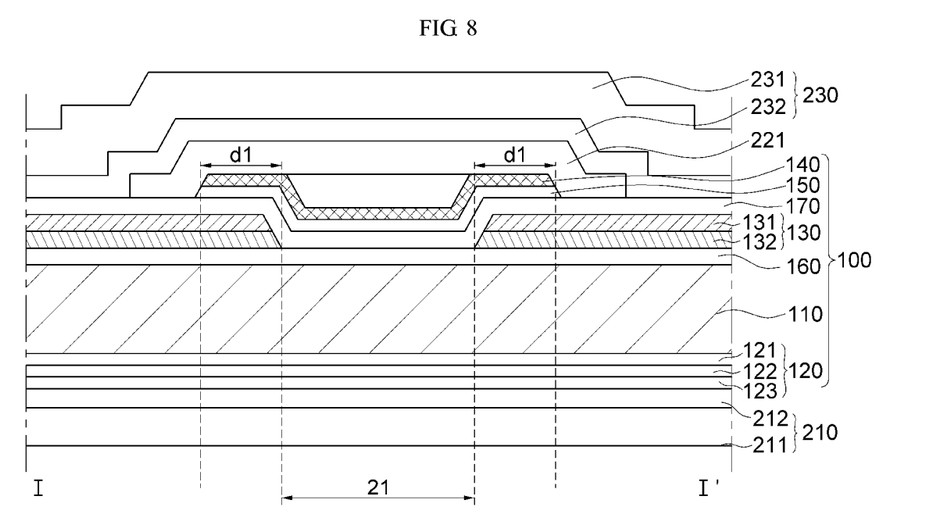
FIG. 8 is a cross-sectional view illustrating still another embodiment of a cover window member taken along line I-I' of FIG. 4.

FIG. 8 is a cross-sectional view illustrating still another embodiment of a cover window member taken along line I-I' of FIG. 4.

In the cover window member CWP of FIG. 8, the adhesive 222 is not disposed between the opening protective film 221 and the anti-pollution layer 140.

More specifically, the cover window member CWP includes the opening protective film 221 disposed on the back surface of the cover window 100 and covering one or two or more of the opening 20 of the cover window 100.

Referring to FIG. 8, the adhesive 222 is not applied over the front surface of the opening protective film 221, and the opening protective film 221 may directly contact a back surface of the light blocking layer 130 and a back surface of the anti-pollution layer 140. The opening protective film 221 may be a relatively thin film sheet of material or a masking tape material on which the adhesive 222 is not disposed.

Referring to FIGS. 3a and 8, the cover window member CWP includes a back surface protection member 230 disposed on the back surface of the cover window 100 and covering an entirety of the back surface of the cover window 100. A portion of the back surface protection member 230 is disposed on a back surface of the opening protective film 221, and directly covers the back surface of the opening protective film 221 and the back surface of the cover window 100 that is not covered by the opening protective film 221.

Referring to FIG. 8, the back surface protection member 230 may include a back surface protective film 231 and an adhesive 232. The adhesive 232 may attach a back surface of the opening protective film 221 and the front surface of the back surface protective film 231 to each other. In addition, the adhesive 232 may attach the front surface of the back surface protective film 231 and the back surface of the cover window 100 that is not covered with the opening protective film 221, to each other. The adhesive 232 for attaching the back surface of the cover window 100 and the front surface of the back surface protective film 231 encloses the opening protective film 221 in a top plan view. That is, the adhesive 232 seals the opening protective film 221 on the cover window 100 such that the opening protective film 221 is not exposed outside the cover window member CWP.

Accordingly, the opening protective film 221 may be fixed to the back surface of the cover window 100 by the back surface protection member 230 even when the adhesive 222 is omitted.

Figure 9:
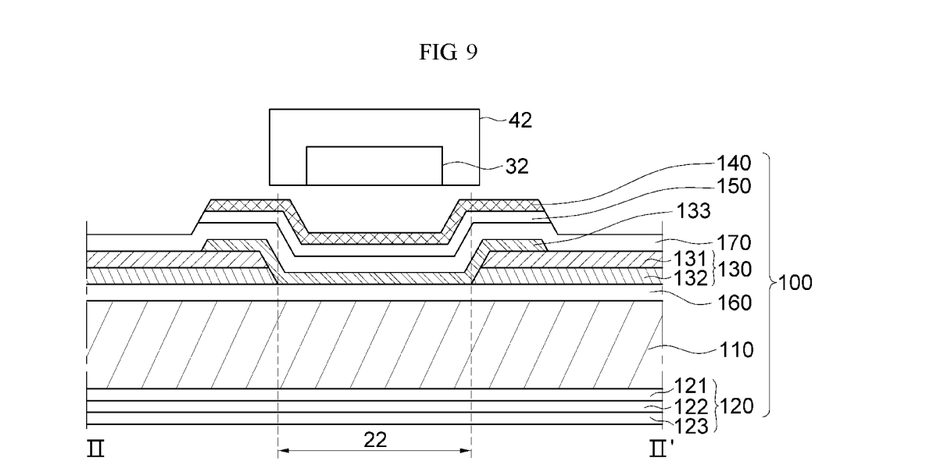
FIG. 9 is a cross-sectional view illustrating another embodiment of a cover window of a cover window member with respect to a portion of a display device.

FIG. 9 is a cross-sectional view illustrating another embodiment of a cover window of a cover window member with respect to a portion of a display device.

The proximity sensor opening 22 illustrated in FIG. 9 may correspond to the proximity sensor opening 22 for the proximity sensor light receiving portion 32 in FIG. 3a. FIG. 9 may correspond to a cross-sectional view taken along line II-II' in FIG. 4. The proximity sensor light receiving portion 32 may sense an infrared signal.

The cover window 100 illustrated in FIG. 9 further includes a third light blocking layer 133. The remaining configuration is the same as that described with reference to FIGS. 1 to 8, and thus a detailed description thereof will be omitted.

The first layer 160, the first light blocking layer 132 and the second light blocking layer 131 are sequentially disposed from the back surface of the transparent layer 110, as described above. The first light blocking layer 132 and the second light blocking layer 131 include or define the proximity sensor opening 22 as an example of the opening 20, and the proximity sensor opening 22 overlaps the proximity sensor light receiving portion 32 of a proximity sensor module 42 in a top plan view. Similar to FIG. 6, the proximity sensor module 42 is shown disposed facing the back surface of the cover window 100 which faces toward the display panel 33 and layers of the display panel 33 are omitted for convenience of illustration. It will be understood that the proximity sensor module 42 may be disposed within the display panel 33.

The third light blocking layer 133 is disposed on the back surface of the transparent layer 110 that is exposed by the opening 20 of the first light blocking layer 132 and the second light blocking layer 131. In addition, the third light blocking layer 133 is disposed extending to from the opening 20 (shown as the proximity sensor opening 22 in FIG. 9), along side surfaces of the first light blocking layer 132 and the second light blocking layer 131 which define the opening 20, to be disposed on a back surface of the second light blocking layer 131. A planar area of the third light blocking layer 133 is larger than a planar area of the opening 20, in a top plan view.

The third light blocking layer 133 may include a light semi-transmissive ink that selectively transmits infrared light.

The second layer 170, the adhesion improving layer 150, and the anti-pollution layer 140 are sequentially disposed from a back surface of the third light blocking layer 133.

Figure 10:
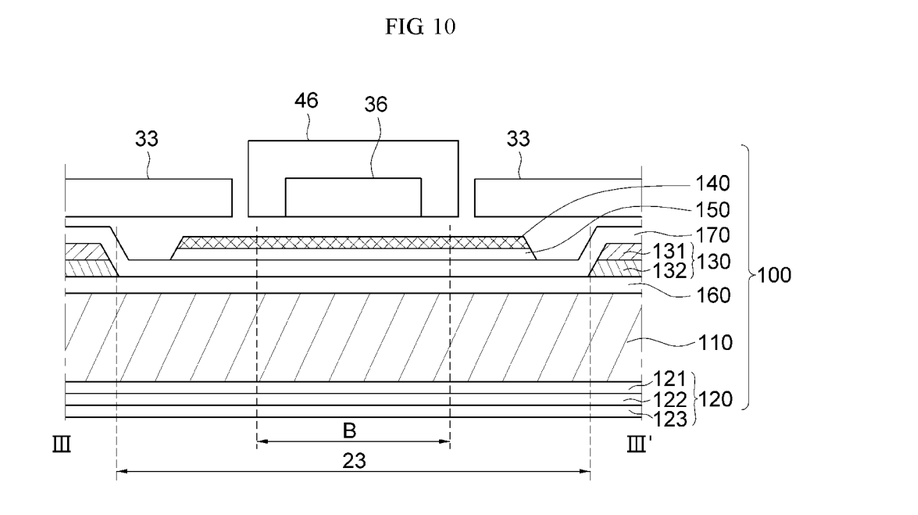
FIGS. 10 and 11 are cross-sectional views illustrating still other embodiments of a cover window of the cover window member with respect to a portion of display device.
Figure 11:
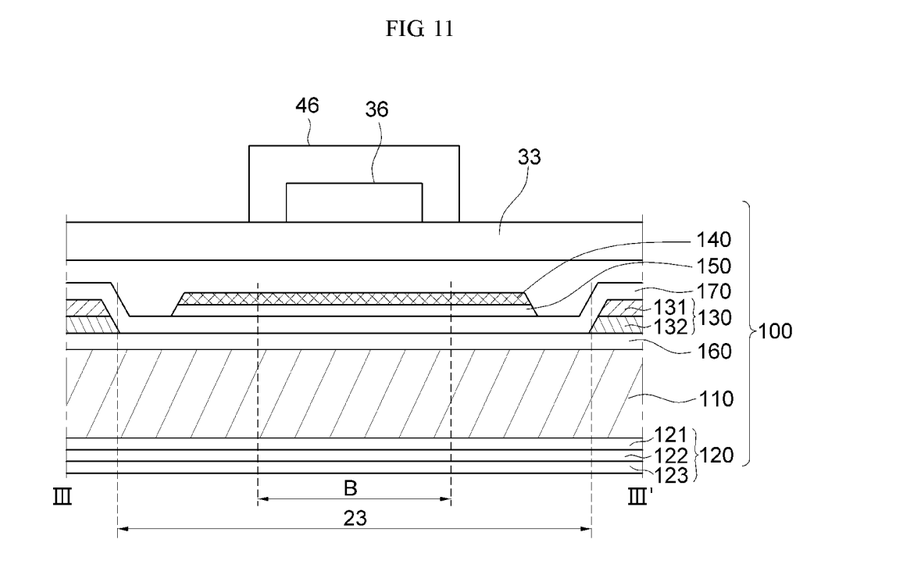

FIGS. 10 and 11 are cross-sectional views illustrating still other embodiments of a cover window of the cover window member with respect to a portion of display device.

The image display opening 23 illustrated in FIGS. 10 and 11 corresponds to the image display opening 23 for the display panel 33 of FIG. 3a. FIGS. 10 and 11 may correspond to a cross-sectional view taken along line in FIG. 3a.

The display device DD may include the light receiving portion 36 for a sensor 46 such as a fingerprint recognition sensor and a camera. However, embodiments are not limited thereto, and the display device DD may include any light receiving sensor. The sensor 46 may be disposed in the image display area of the display panel 33. The image display area may correspond to the image display opening 23 of the cover window member CWP, without being limited thereto.

As illustrated in FIG. 10, the sensor 46 may be disposed at an opening that is defined extended through a thickness of the display panel 33. Alternatively, as illustrated in FIG. 11, the sensor 46 may be disposed on a back surface of the display panel 33, and light may be transmitted through the display panel 33 to be incident on the light receiving portion 36. The light receiving portion 36 of the display device DD overlaps an area B of the image display opening 23 of the cover window member CWP in a top plan view.

Referring to FIGS. 10 and 11, the light blocking layer 130 includes the image display opening 23, and the light receiving portion 36 of the display device DD is disposed corresponding to the image display opening 23 of the cover window member CWP.

The remaining configuration except for the light blocking layer 130 and the anti-pollution layer 140 is the same as that described with reference to FIGS. 1 to 8, and thus a detailed description thereof will be omitted.

As described above, the first layer 160 and the light blocking layer 130 are sequentially disposed from the back surface of the transparent layer 110. The light blocking layer 130 includes the image display opening 23. The image display opening 23 may have a planar area substantially equal to a planar area of the image display area of the display panel 33, in a top plan view. In addition, the area B of the image display opening 23 of the cover window member CWP overlaps the light receiving portion 36 of the display device DD in a top plan view.

The second layer 170 is disposed on portions of the light blocking layer 130 and the first layer 160 that are exposed at the image display opening 23, and the adhesion improving layer 150 and the anti-pollution layer 140 are sequentially disposed from the second layer 170.

The anti-pollution layer 140 and the adhesion improving layer 150 are disposed only at the area B among an overall planar area of the image display opening 23. In a top plan view, each of a planar area of the anti-pollution layer 140 and a planar area of the adhesion improving layer 150 is less than an entirety of the planar area of the image display opening 23 and larger than each of a total planar area B and a total planar area of the light receiving portion 36. The anti-pollution layer 140 and the adhesion improving layer 150 may not overlap the light blocking layer 130 in a top plan view. That is, outer edges of the anti-pollution layer 140 and the adhesion improving layer 150 may be spaced apart from side surfaces of the light blocking layer 130 which define the image display opening 23.

Accordingly, as the anti-pollution layer 140 is disposed in an area overlapping the light receiving portion 36 corresponding to the image display opening 23, the adhesive 222 of the back surface protection member 230 (refer to FIGS. 5 and 7) remaining in the area overlapping the light receiving portion 36 corresponding to the image display opening 23 may be reduced or substantially prevented.

As described above for FIG. 3b, different from the camera lens opening 21 and the proximity sensor opening 22 shown in FIG. 3a as an example of the opening 20, areas 21-1 and 22-1 corresponding to the camera lens 31 and the proximity sensor light receiving portion 32 in an image display area of the display panel 33 may not include the opening 20 separately defined in the cover window member CWP. Referring to FIG. 3b along with FIGS. 10 and 11, a configuration of the cover window 100 corresponding to the light receiving portion 36 in the image display opening 23 in FIGS. 10 and 11, may be substantially the same as the configuration of the cover window 100 corresponding to the camera lens 31 and the proximity sensor light receiving portion 32 (refer to FIGS. 6 and 9) at the area A-1 in the image display opening 23 in FIG. 3b.

As set forth hereinabove, according to one or more embodiments of the invention, an adhesive remaining in an opening of a light blocking layer may be reduced or substantially prevented by covering the opening with an anti-pollution layer.

While the invention has been illustrated and described with reference to the embodiments thereof, it will be apparent to those of ordinary skill in the art that various changes in form and detail may be made thereto without departing from the spirit and scope of the invention.

What is claimed is:
1. A cover window of a display device, comprising:
a transparent layer;
a light blocking layer disposed on the transparent layer, the light blocking layer defining an opening therein which corresponds to a light sensor of the display device and exposes a portion of the transparent layer to outside the light blocking layer to define an exposed portion of the transparent layer;

the light blocking layer and the exposed portion of the transparent layer defining a recess which corresponds to the light sensor of the display device; and an anti-pollution layer in the recess, the anti-pollution layer between the light sensor of the display device and the exposed portion of the transparent layer, wherein the anti-pollution layer has a surface energy lower than each of a surface energy of the transparent layer and a surface energy of the light blocking layer.

2. The cover window of claim 1, wherein the anti-pollution layer is disposed in the opening and extends from the opening to be disposed on a portion of the light blocking layer which is adjacent to the opening.

3. The cover window of claim 1, wherein the anti-pollution layer is disposed in the opening and extends to have a planar area larger than a planar area of the opening.

4. The cover window of claim 1, wherein the surface energy of the anti-pollution layer is about 40 dynes per centimeter or less.

5. The cover window of claim 1, wherein the surface energy of the anti-pollution layer is about 20 dynes/cm or less.

6. The cover window of claim 1, wherein the anti-pollution layer which is in the recess which corresponds to the light sensor of the display device has a water contact angle of about 90 degrees or more.

7. The cover window of claim 1, wherein the anti-pollution layer which is in the recess which corresponds to the light sensor of the display device has a hexadecane contact angle of about 25 degrees or more.

8. The cover window of claim 1, wherein the anti-pollution layer which is in the recess which corresponds to the light sensor of the display device includes a fluorine material.

9. The cover window of claim 8, wherein the fluorine material includes at least one of perfluoropolyether, polytetrafluoroethylene, fluorinated ethylene propylene and a perfluoroalkyl vinyl ether copolymer.

10. The cover window of claim 1, wherein the anti-pollution layer further includes an adhesion improving layer which improves adhesion of the anti-pollution layer to the light blocking layer, the adhesion improving layer disposed corresponding to the exposed portion of the transparent layer.

11. The cover window of claim 10, wherein the adhesion improving layer includes $SiO_2$.

12. The cover window of claim 1, wherein the anti-pollution layer has a protrusion pattern on a surface of the anti-pollution layer which is opposite to the transparent layer.

13. The cover window of claim 1, further comprising a first protective film removably disposable on a surface of the anti-pollution layer which is opposite to the transparent layer.

14. The cover window of claim 13, wherein the first protective film and the anti-pollution layer are removably attached to each other using a first adhesive.

15. The cover window of claim 13, further comprising a second protective film removably attachable to a surface of the first protective film which is opposite to the transparent layer, wherein the first protective film and the second protective film are removably attached to each other using a second adhesive.

16. The cover window of claim 15, wherein the second adhesive seals the first protective film on the anti-pollution layer.

17. The cover window of claim 1, wherein the anti-pollution layer is disposed in the opening to be spaced apart from side surfaces of the light blocking layer which define the opening therein.

18. A display device comprising:
a display panel;
a light receiving sensor; and
a cover window disposed overlapping the display panel and the light receiving sensor,
wherein the cover window comprises:
a transparent layer;
a first light blocking layer disposed between the transparent layer and the display panel, the first light blocking layer defining an opening therein which corresponds to the light receiving sensor of the display device and exposes a portion of the transparent layer to outside the light blocking layer to define an exposed portion of the transparent layer;
the first light blocking layer and the exposed portion of the transparent layer defining a recess which corresponds to the light receiving sensor of the display device; and
an anti-pollution layer in the recess, the anti-pollution layer disposed between the first light blocking layer and the display panel and between the light receiving sensor of the display device and the exposed portion of the transparent layer,
wherein the anti-pollution layer has a surface energy lower than each of a surface energy of the transparent layer and a surface energy of the light blocking layer.

19. The display device of claim 18, wherein
the light receiving sensor to which the exposed portion of the transparent layer corresponds includes an infrared sensor, and
the cover window further includes a second light blocking layer including a semi-transmissive material layer disposed between the first light blocking layer and the anti-pollution layer, the second light blocking layer corresponding to the exposed portion of the transparent layer.

20. The display device of claim 18, wherein
the opening defined by the first light blocking layer corresponds to an image display area of the display panel, and
the light receiving sensor overlaps the opening corresponding to the image display area, in a top plan view.

* * * * *